United States Patent
Kim et al.

(10) Patent No.: US 6,835,658 B2
(45) Date of Patent: Dec. 28, 2004

(54) METHOD OF FABRICATING CAPACITOR WITH HAFNIUM

(75) Inventors: Kyong-Min Kim, Ichon-shi (KR); Jong-Min Lee, Ichon-shi (KR); Hoon-Jung Oh, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/640,908

(22) Filed: Aug. 13, 2003

(65) Prior Publication Data

US 2004/0126980 A1 Jul. 1, 2004

(30) Foreign Application Priority Data

Dec. 27, 2002 (KR) ................................ 10-2002-0085087
Dec. 30, 2002 (KR) ................................ 10-2002-0086311

(51) Int. Cl.[7] ............................................. H01L 21/44
(52) U.S. Cl. ...................... 438/681; 438/680; 438/239; 438/381
(58) Field of Search ................................ 438/253, 239, 438/381, 396, 579, 582, 660, 663, 647, 648, 680, 681, 683, 684, 685, 689, 770, 775, 706, 745

(56) References Cited

U.S. PATENT DOCUMENTS

| | | | | | |
|---|---|---|---|---|---|
| 5,552,337 | A | * | 9/1996 | Kwon et al. | 438/681 |
| 5,641,702 | A | * | 6/1997 | Imai et al. | 438/396 |
| 6,583,021 | B2 | * | 6/2003 | Song | 438/396 |
| 6,674,138 | B1 | * | 1/2004 | Halliyal et al. | 257/411 |

* cited by examiner

Primary Examiner—David Nhu
(74) Attorney, Agent, or Firm—Blakely Sokoloff Taylor & Zafman

(57) ABSTRACT

The present invention provides a method for fabricating a capacitor constituted with double hafnium oxide layers through a plasma enhanced chemical vapor deposition (PECVD) process and a low pressure chemical vapor deposition (LPCVD) process. The method for fabricating the capacitor constituted with the double hafnium oxide layers includes: forming a lower electrode layer over a semiconductor substrate; performing a heat treatment with the lower electrode; forming a first $HfO_2$ layer over the first $HfO_2$ layer by using a plasma enhanced chemical vapor deposition (PECVD) method; forming a second $HfO_2$ layer over the first $HfO_2$ layer by using a low pressure chemical vapor deposition (LPCVD) method; and performing a plasma treatment process at a high temperature; and forming an upper electrode over the second $HfO_2$ layer.

10 Claims, 2 Drawing Sheets

RAIID THERMAL NITRIDATION (RTN) PROCESS
OR NH₃ PLASMA TREATMENT PROCESS

O₂ N₂ O OR O₃ PLASMA TREATMENT AT A HIGH TEMPERATURE

METHOD OF FABRICATING CAPACITOR WITH HAFNIUM

FIELD OF THE INVENTION

The present invention relates to a capacitor in a semiconductor device; and, more particularly, to a method for fabricating the capacitor constituted with double hafnium oxide layers formed through a plasma enhanced chemical vapor deposition (PECVD) process and a low pressure chemical vapor deposition (LPCVD) process.

DESCRIPTION OF RELATED ARTS

As a semiconductor memory device is highly integrated, size of a unit cell thereof is decreased, and size of a capacitor constituting the unit cell is also decreased. Along with the reduced size, the capacitor for storing a data should secure enough amount of electrical charge to guarantee a stable operation of the semiconductor memory device.

The enough amount of electrical charge can be obtained by increasing an active surface area of the capacitor. As a most preferable method, the increased active surface area of the capacitor can be obtained by increasing height of the capacitor. However, the method mentioned above makes it difficult for a etch process to be carried out. Accordingly, the method is hardly ever applied to a capacitor fabrication.

A $Ta_2O_5$ layer is usually used for forming the capacitor. However, a thermal stability of the $Ta_2O_5$ layer is poor, and a dielectric constant of the $Ta_2O_5$ is low. Therefore, enough capacitance to operate the semiconductor memory device can not be obtained. To overcome the problems mentioned above, the $Ta_2O_5$ layer is substituted with a $HfO_2$ layer.

The dielectric constant of $HfO_2$ is higher than that of $Ta_2O_5$. Also, the thermal stability and a current leakage property of the $HfO_2$ are superior to those of $Ta_2O_5$, and therefore, it is possible to secure enough capacitance to operate the semiconductor memory device.

According to a prior art, an atomic layer deposition (ALD) method is conventionally used to form the capacitor constituted with the $HfO_2$ layer because it is possible to get a good step coverage and form the $HfO_2$ layer containing few impurities. Also, a low pressure chemical vapor deposition (LPCVD) method can be used to form the capacitor constituted with the $HfO_2$ layer. At this time, a process throughput time can be decreased by the LPCVD method, and therefore, process productivity can be increased.

However, in case of the ALD method, it takes much time to perform the ALD process and thereby, increasing the process throughput time and decreasing the productivity.

In case of the LPCVD method, it is impossible to get a good quality of $HfO_2$ layer. Therefore, processes for removing the impurities from the $HfO_2$ layer are required. More specifically, to remove the impurities, a first heat treatment is carried out at a low temperature ranging from about 300° C. to about 500° C. through a $O_2$ or $N_2O$ plasma treatment process. A second heat treatment using a conventional furnace is then carried out at a high temperature ranging from about 500° C. to about 650° C. in oxygen ambient. However, the heat treatment processes mentioned above are complicated, and the impurities inside the $HfO_2$ layer can not be removed effectively.

SUMMARY OF THE INVENTION

It is, therefore, an object of the present invention to provide a method for fabricating the capacitor constituted with double hafnium oxide layers formed through a plasma enhanced chemical vapor deposition (PECVD) process and a low pressure chemical vapor deposition (LPCVD) process.

In accordance with an aspect of the present invention, there is provided the method for fabricating the capacitor, including: forming a lower electrode over a semiconductor substrate; performing a heat treatment with the lower electrode; forming a first $HfO_2$ layer over the first $HfO_2$ layer by using a plasma enhanced chemical vapor deposition (PECVD) method; forming a second $HfO_2$ layer over the first $HfO_2$ layer by using a low pressure chemical vapor deposition (LPCVD) method; performing a plasma treatment process at a high temperature; and forming an upper electrode over the second $HfO_2$ layer.

BRIEF DESCRIPTION OF THE DRAWINGS

Other objects and aspects of the present invention will become apparent from the following description of the embodiments with reference to the accompanying drawings, in which.

DETAILED DESCRIPTION OF THE PREFERRED EMBODIMENTS

Hereinafter, an inventive capacitor in a semiconductor memory device and a method for fabricating the same will be described in detail referring to the accompanying drawings.

FIGS. 1A to 1D are process steps describing a method for forming an $HfO_2$ capacitor in accordance with an preferred embodiment of the present invention.

Figure 1A:
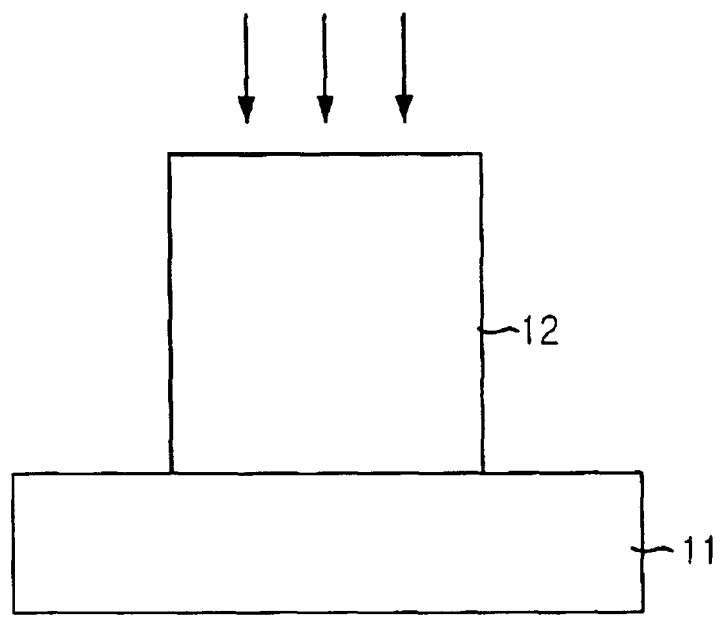
FIGS. 1A to 1D show a series of processes describing a method for a capacitor constituted with double hafnium oxide layers formed through a plasma enhanced chemical vapor deposition (PECVD) process and a low pressure chemical vapor deposition (LPCVD) process.

As shown in FIG. 1A, a lower electrode 12 is formed over a semiconductor substrate 11 by depositing a poly-silicon material. Thereafter, a wet etching process for removing an impurity or native oxide layer on the lower electrode 12 is carried out by using a hydrogen fluoride (HF) liquid or a solution of the HF liquid, and an ammonium hydroxide ($NH_4OH$) liquid.

To prevent an oxidation of the lower electrode at a heat treatment process performed at a high temperature and in oxygen ambient, a rapid thermal nitridation (RTN) process or a $NH_3$ plasma treatment process is carried out.

More specifically, the RTN process is carried out by using $NH_3$ gas. At this time, a flow rate of the $NH_3$ gas is maintained at a range of about 1 slm to about 20 slm, and a process temperature ranges from about 500° C. to about 800° C. The semiconductor substrate is annealed under an atmospheric pressure. At this time, an annealing time for the annealing process ranges from about 60 seconds to about 180 seconds.

In case of the $NH_3$ plasma treatment process, the flow rate of the $NH_3$ gas is maintained at a range of about 10 sccm to about 1000 sccm, and a RF power for a plasma excitement ranges from about 50 Watt to about 400 Watt. Also, the pressure for the $NH_3$ plasma treatment process ranges from about 0.1 torr to about 2.0 torr, and a process time of about 30 secs to about 300 secs is preferable for the $NH_3$ plasma treatment process.

Figure 1B:
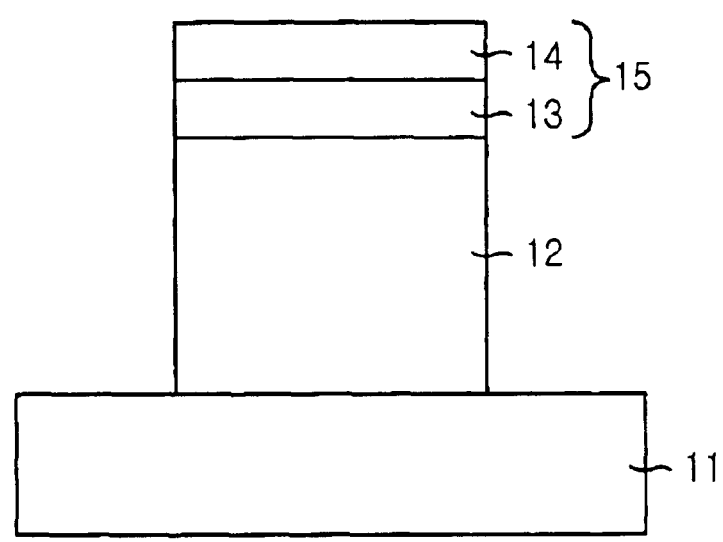

As shown in FIG. 1B, a double layered capacitor 15 is formed over the poly-silicon layer 12. In short, the double layered capacitor 15 is constituted with a first $HfO_2$ layer 13 and a second $HfO_2$ layer 14, and the first $HfO_2$ layer 13 and the second $HfO_2$ layer 14 are formed by using a plasma enhanced chemical vapor deposition (PECVD) method and a low pressure chemical vapor deposition (LPCVD) method, respectively, after completing the process for preventing the oxidation of the lower electrode.

For reference, a source gas such as $HfCl_4$, $Hf(NO_3)_4$, $Hf(NCH_2C_2H_5)_4$ and $Hf(OC_2H_5)_4$ is used for the PECVD and the LPCVD method.

A method for forming a first $HfO_2$ layer over the poly-silicon layer 12 by using the PECVD method will be described.

The aforementioned source gas is injected into a PECVD process chamber after being vaporized by using a vaporizer. The pressure inside the PECVD process chamber is maintained at a range of about 0.1 torr to about 10 torr, and a sub-heater temperature is maintained at about 200° C. to about 400° C. in order to heat the semiconductor substrate. The RF power for the plasma excitement ranges from about 50 Watt to about 400 Watt. At this time, the sub-heater is used as a ground, and a shower head is used as an electrode. $O_2$ or $N_2O$ is used as a reaction gas, and the flow rate of the reaction gas ranges from about 10 sccm to about 1000 sccm. Usually, a quality of the $HfO_2$ layer formed by using the PECVD method is superior to that of the $HfO_2$ layer formed by using the LPCVD method because the $HfO_2$ layer is densely formed by using the PECVD method. Therefore, an interface property between the poly-silicon layer and the $HfO_2$ layer can be remarkably improved.

The second $HfO_2$ layer 14 is formed by using the LPCVD method. At this time, the aforementioned source gas is injected into a LPCVD process chamber after being vaporized by using the vaporizer. The pressure inside the LPCVD process chamber is maintained at a range of about 0.1 torr to about 10 torr, and the temperature of the sub-heater is maintained at about 200° C. to about 400° C. Also, $O_2$ or $N_2O$ is used as the reaction gas. At this time, the flow rate of the reaction gas ranges from about 10 sccm to about 1000 sccm. In case that the $HfO_2$ layer is formed by using the LPCVD method, step coverage of the formed $HfO_2$ layer is remarkably improved. Therefore, an electrical property of the capacitor is improved.

As a result, the double layered capacitor constituted with the first and second $HfO_2$ layer 13 and 14 has both of advantageous properties obtained by the PECVD and LPCVD method.

Figure 1C:
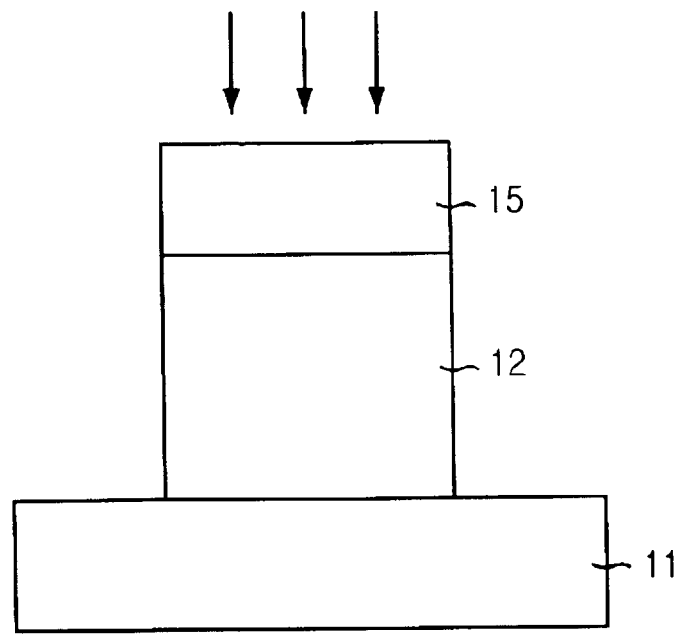

Illustrated in FIG. 1C as a next step, a plasma treatment process is carried out to remove impurities such as carbon and reduce oxygen vacancies from the second $HfO_2$ layer. At this time, the plasma treatment process is carried out at a high temperature ranging from about 500° C. to about 800 C., and an oxygen-based plasma source gas such as $O_2$, $N_2O$ or $O_3$ gas is used as a plasma treatment source gas. If the $O_2$ or $N_2O$ gas is used as the plasma source gas, the flow rate of the $O_2$ or $N_2O$ gas ranges from about 10 sccm to about 1000 sccm. If the $O_3$ gas is used as the plasma source gas, the flow rate of the $O_3$ gas ranges from about 10000 ppm to about 200000 ppm. Also, the pressure inside a plasma treatment process chamber ranges from about 0.1 torr to about 10 torr.

The RF power for the plasma excitement ranges from about 50 Watt to about 400 Watt. At this time, the sub-heater is used as a ground, and a shower head is used as an electrode. A plasma treatment process time of about 1 minute to about 20 minutes is preferable.

Especially, the impurities or the oxygen vacancies inside the second $HfO_2$ layer can be removed or reduced by carrying out the plasma treatment process only once.

Figure 1D:
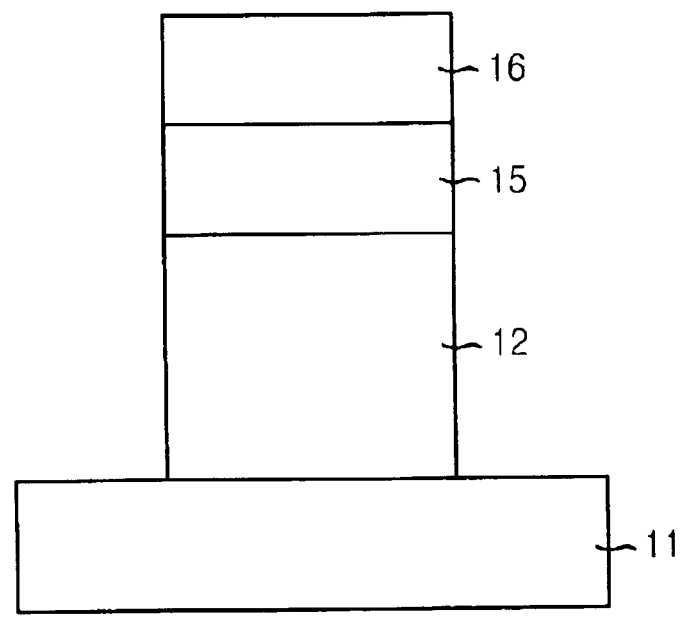

Illustrated in FIG. 1D as a last process, an upper electrode 16 constituted with a titanium nitride (TiN) and a poly-silicon is formed over the second $HfO_2$ layer. Eventually, a complete capacitor in the semiconductor memory device is obtained.

Although the preferred embodiment of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor in a semiconductor memory device, comprising the steps of:

a1) forming a lower electrode layer over a semiconductor substrate;

a2) performing a heat treatment with the lower electrode;

a3) forming a first $HfO_2$ layer over the lower electrode layer by using a plasma enhanced chemical vapor deposition (PECVD) method to improve an interface property;

a4) forming a second $HfO_2$ layer over the first $HfO_2$ layer by using a low pressure chemical vapor deposition (LPCVD) method to improve a step coverage;

a5) performing a plasma treatment process at a high temperature; and a6) forming an upper electrode over the second $HfO_2$ layer.

2. The method as recited in claim 1, wherein the step a3) is carried out by using one of $Hf\,Cl_4$, $Hf\,(NO_3)_4$, $Hf\,(NCH_2C_2H_5)_4$ and $Hf\,(OC_2H_5)_4$ as a source gas, and one of $O_2$ and $N_2O$ as a reaction gas at a pressure ranging from about 0.1 torr to about 10 torr, a temperature of a sub-heater ranging from about 200° C. to about 400° C. and a RF power ranging from about 50 Watt to about 400 Watt.

3. The method as recited in claim 1, wherein the step a4) is carried out by using one of $Hf\,Cl_4$, $Hf\,(NO_3)_4$, $Hf\,(NCH_2C_2H_5)_4$ and $Hf\,(OC_2H_5)_4$ as a source gas, and one of $O_2$ and $N_2O$ as a reaction gas of which a flow rate ranges from about 10 sccm to about 1000 sccm at a pressure ranging from about 0.1 torr to about 10 torr and a temperature of a subheater ranging from about 200° C. to about 400° C.

4. The method as recited in claim 1, wherein the step a1) further includes the step of:

performing a wet etching process for removing an impurity and an native oxide.

5. The method as recited in claim 1, wherein in the step a2), the lower electrode is constituted with a polysilicon layer and a RTN or $NH_3$ plasma treatment is carried out.

6. The method as recited in claim 1, wherein the step a5) is carried out to remove or reduce impurities such as a carbon and oxygen vacancies from the second $HfO_2$ layer at the high temperature ranging from about 500° C. to about 800° C. only once.

7. The method as recited in claim 6, wherein the plasma treatment process is carried out by using $O_2$ or $N_2O$ gas as a plasma source gas of which a flow rate ranges from about 10 sccm to about 1000 sccm.

8. The method as recited in claim 6, wherein the plasma treatment process is carried out by using $O_3$ gas as a plasma source gas of which a flow rate ranges from about 10000 ppm to about 200000 ppm.

9. The method as recited in claim 6, wherein the plasma treatment process is carried out at a temperature of a plasma treatment process chamber ranging from about 0.1 torr to about 10 torr and a RE power ranging from about 50 Watt to about 400 Watt for about 1 mins to about 20 mins.

10. The method as recited in claim 1, wherein in the step a6), the upper electrode is constituted with a polysilicon layer and a titanium nitride layer.

* * * * *